US012795991B2

(12) United States Patent
Aichinger et al.

(10) Patent No.: US 12,795,991 B2
(45) Date of Patent: Nov. 10, 2026

(54) VERTICAL POWER SEMICONDUCTOR DEVICE INCLUDING A SENSOR ELECTRODE

(71) Applicant: Infineon Technologies AG, Neubiberg (DE)

(72) Inventors: Thomas Aichinger, Faak am See (AT); Dethard Peters, Höchstadt (DE); Michael Hell, Erlangen (DE); Andreas Hürner, Heroldsberg (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 18/920,187

(22) Filed: Oct. 18, 2024

(65) Prior Publication Data

US 2025/0151324 A1 May 8, 2025

(30) Foreign Application Priority Data

Nov. 6, 2023 (DE) ......................... 102023130579.4

(51) Int. Cl.

| | |
|---|---|
| ***H10D 30/66*** | (2025.01) |
| ***G01R 19/165*** | (2006.01) |
| ***H03K 17/082*** | (2006.01) |
| ***H10D 12/00*** | (2025.01) |
| ***H10D 62/832*** | (2025.01) |
| *H03K 17/08* | (2006.01) |

(52) U.S. Cl.

CPC ..... *H10D 30/669* (2025.01); *G01R 19/16519* (2013.01); *H03K 17/0822* (2013.01); *H03K 17/0828* (2013.01); *H10D 12/441* (2025.01); *H10D 12/481* (2025.01); *H10D 30/668* (2025.01); *H10D 62/8325* (2025.01); *H03K 2017/0806* (2013.01); *H03K 2217/0027* (2013.01); *H03K 2217/0054* (2013.01)

(58) Field of Classification Search

CPC .. H10D 30/669; H10D 12/441; H10D 12/481; H10D 30/668; H10D 62/8325; H10D 12/031; G01R 19/16519; H03K 17/0822; H03K 17/0828; H03K 2017/0806; H03K 2217/0027; H03K 2217/0054

See application file for complete search history.

(56) References Cited

U.S. PATENT DOCUMENTS

| | | | | |
|---|---|---|---|---|
| 2014/0225114 | A1* | 8/2014 | Furukawa ............ | H10D 30/665 257/48 |
| 2022/0149165 | A1 | 5/2022 | Lichtenwalner et al. | |

* cited by examiner

*Primary Examiner* — Jung Kim
(74) *Attorney, Agent, or Firm* — Murphy, Bilak & Homiller, PLLC

(57) ABSTRACT

A vertical power semiconductor device includes a silicon carbide (SiC) semiconductor body having opposite first and second surfaces. The SiC semiconductor body includes a transistor cell area including gate structures, a gate pad area, and an interconnection area electrically coupling a gate electrode of the gate structures and a gate pad of the gate pad area via a gate interconnection. The vertical power semiconductor device further includes a sensor electrode and a first interlayer dielectric having a first interface to the sensor electrode and a second interface to at least one of the gate electrode or the gate interconnection. A conduction band offset at the first interface ranges from 1 eV to 2.5 eV. The vertical power semiconductor device further includes a second interface to at least one of the gate electrode or the gate interconnection. The second interlayer dielectric laterally adjoins to the first interlayer dielectric.

14 Claims, 3 Drawing Sheets

VERTICAL POWER SEMICONDUCTOR DEVICE INCLUDING A SENSOR ELECTRODE

TECHNICAL FIELD

The present disclosure is related to a vertical power semiconductor device, in particular to a vertical power semiconductor device including a sensor electrode.

BACKGROUND

Technology development of new generations of SiC power semiconductor devices, e.g. insulated gate field effect transistors (IGFETs) such as metal oxide semiconductor field effect transistors (MOSFETs) or insulated gate bipolar transistors (IGBTs), aims at improving electric device characteristics such as the short-circuit withstand time. A variety of tradeoffs and challenges have to be met when improving the short-circuit withstand time of a SiC power semiconductor device.

There is a need for improving the short-circuit current capability of SiC power semiconductor devices.

SUMMARY

An example of the present disclosure relates to a vertical power semiconductor device. The vertical power semiconductor device includes a silicon carbide, SiC, semiconductor body having a first surface and a second surface opposite to the first surface. The SiC semiconductor body includes a transistor cell area comprising gate structures, a gate pad area, and an interconnection area electrically coupling a gate electrode of the gate structures and a gate pad of the gate pad area via a gate interconnection. The vertical power semiconductor device further includes a sensor electrode. The vertical power semiconductor device further includes a first interlayer dielectric comprising a first interface to the sensor electrode and a second interface to at least one of the gate electrode or the gate interconnection. A value of a conduction band offset at the first interface of the first interlayer dielectric ranges from 1 eV to 2.5 eV. The vertical power semiconductor device further includes a second interlayer dielectric comprising a second interface to at least one of the gate electrode or the gate interconnection. The second interlayer dielectric laterally adjoins to the first interlayer dielectric.

Another example of the present disclosure relates to a vertical power semiconductor device. The vertical power semiconductor device includes a silicon carbide, SiC, semiconductor body having a first surface and a second surface opposite to the first surface. The SiC semiconductor body includes a transistor cell area comprising gate structures, a gate pad area, and an interconnection area electrically coupling a gate electrode of the gate structures and a gate pad of the gate pad area via a gate interconnection. The power semiconductor device further includes a sensor electrode. The power semiconductor device further includes a first interlayer dielectric comprising a first interface to the sensor electrode and a second interface to at least one of the gate electrode or the gate interconnection. A value of a valence band offset at the second interface of the first interlayer dielectric ranges from 1.0 eV to 2.5 eV. The vertical power semiconductor device further includes a second interlayer dielectric comprising a second interface to at least one of the gate electrode or the gate interconnection. The second interlayer dielectric laterally adjoins to the first interlayer dielectric.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the embodiments and are incorporated in and constitute a part of this specification. The drawings illustrate embodiments of SiC power semiconductor devices and power systems and together with the description serve to explain principles of the embodiments. Further embodiments are described in the following detailed description and the claims.

DETAILED DESCRIPTION

Figure 1A:
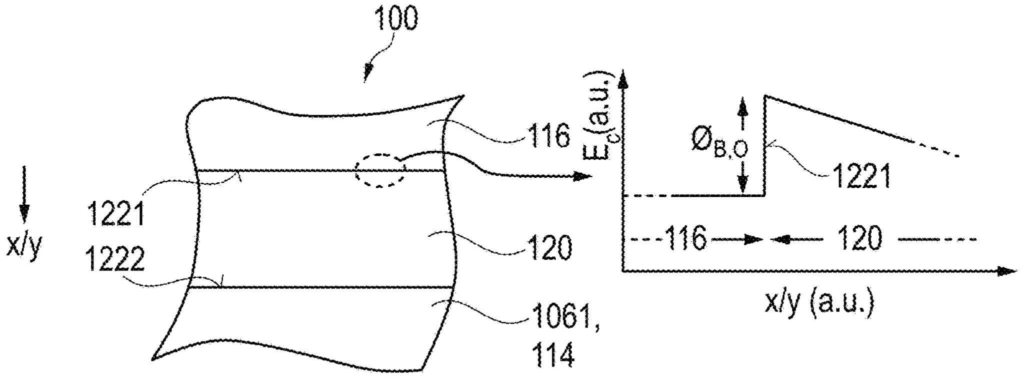
FIG. 1A schematically and exemplarily shows a view of a configuration example of a SiC power semiconductor device including a first interlayer dielectric comprising a first interface to a sensor electrode and a second interface to a gate electrode or a gate interconnection.

In the following detailed description, reference is made to the accompanying drawings, which form a part hereof and in which are shown by way of illustrations specific examples in which semiconductor substrates may be processed. It is to be understood that other examples may be utilized and structural or logical changes may be made without departing from the scope of the present disclosure. For example, features illustrated or described for one example can be used on or in conjunction with other examples to yield yet a further example. It is intended that the present disclosure includes such modifications and variations. The examples are described using specific language, which should not be construed as limiting the scope of the appending claims. The drawings are not scaled and are for illustrative purposes only. Corresponding elements are designated by the same reference signs in the different drawings if not stated otherwise.

The terms "having", "containing", "including", "comprising" and the like are open, and the terms indicate the presence of stated structures, elements or features but do not preclude the presence of additional elements or features. The articles "a", "an" and "the" are intended to include the plural as well as the singular, unless the context clearly indicates otherwise.

The term "electrically connected" may describe a permanent low-resistive connection between electrically connected elements, for example a direct contact between the concerned elements or a low-resistive connection via a metal and/or heavily doped semiconductor material. The term "electrically coupled" may include that one or more intervening element(s) adapted for signal and/or power transmission may be connected between the electrically coupled elements, for example, elements that are controllable to temporarily provide a low-resistive connection in a first state and a high-resistive electric decoupling in a second state.

If two elements A and B are combined using an "or", this is to be understood to disclose all possible combinations, i.e. only A, only B as well as A and B, if not explicitly or implicitly defined otherwise. An alternative wording for the same combinations is "at least one of A and B" or "A and/or B". The same applies, mutatis mutandis, for combinations of more than two elements.

Ranges given for physical dimensions include the boundary values. For example, a range for a parameter y from a to b reads as $a \leq y \leq b$. The same holds for ranges with one boundary value like "at most" and "at least".

Main constituents of a layer or a structure from a chemical compound or alloy are such elements which atoms form the chemical compound or alloy. For example, silicon (Si) and carbon (C) are the main constituents of a silicon carbide (SiC) layer.

The term "on" is not to be construed as meaning only "directly on". Rather, if one element is positioned "on" another element (e.g., a layer is "on" another layer or "on" a substrate), a further component (e.g., a further layer) may be positioned between the two elements (e.g., a further layer may be positioned between a layer and a substrate if the layer is "on" said substrate).

A configuration example of a vertical power semiconductor device includes a silicon carbide, SiC, semiconductor body having a first surface and a second surface opposite to the first surface. The SiC semiconductor body includes a transistor cell area comprising gate structures, a gate pad area, and an interconnection area electrically coupling a gate electrode of the gate structures and a gate pad of the gate pad area via a gate interconnection. The vertical power semiconductor device further includes a sensor electrode. The power semiconductor device further includes a first interlayer dielectric comprising a first interface to the sensor electrode and a second interface to at least one of the gate electrode or the gate interconnection. A value of a conduction band offset at the first interface of the sensor electrode may range from 1 eV to 2.5 eV, or from 1.5 eV to 2.1 eV.

The vertical power semiconductor device may be part of an integrated circuit or may be a discrete semiconductor device or a semiconductor module, for example. The power semiconductor device may be or may include an insulated gate field effect transistor (IGFET) such as a metal oxide semiconductor field effect transistor (MOSFET) or an insulated gate bipolar transistor (IGBT), for example. The vertical power semiconductor device has a load current flow between the first surface and the second surface opposite to the first surface. The vertical power semiconductor device may be configured to conduct currents of more than 1 A, or more than 10 A, or more than 30 A, or more than 50 A, or more than 75 A, or even more than 100 A, and may be further configured to block voltages between load electrodes, e.g. between collector and emitter on an IGBT, or between drain and source of a MOSFET, in the range of several hundreds of up to several thousands of volts, e.g. 400 V, 650V, 1.2 kV, 1.7 kV, 3.3 kV, 4.5 kV, 5.5 kV, 6 kV, 6.5 kV, 10 kV. The blocking voltage may correspond to a voltage class specified in a datasheet of the power semiconductor device, for example.

The vertical power semiconductor device may be based on a semiconductor body from a crystalline SiC semiconductor material having a band gap larger than the band gap of silicon, i.e. larger than 1.12 eV. For example, the semiconductor material may be 2H—SiC (SiC of the 2H polytype), 6H—SIC or 15R—SiC. According to an example, the semiconductor material is silicon carbide of the 4H polytype (4H—SiC). The semiconductor body may include or consist of a semiconductor substrate having none, one or more than one semiconductor layers, e.g. epitaxially grown layers, thereon.

The first surface may be a front surface or a top surface of the semiconductor body, and the second surface may be a back surface or a rear surface of the semiconductor body, for ex-ample. The semiconductor body may be attached to a lead frame via the second surface, for example. Over the first surface of the semiconductor body, bond pads may be arranged and bond wires may be bonded on the bond pads, for example.

For realizing a desired current carrying capacity, the vertical SiC power semiconductor device may be designed by a plurality of parallel-connected transistor cells. The parallel-connected transistor cells may, for example, be transistor cells formed in the shape of a strip or a strip segment. Of course, the transistor cells can also have any other shape, e.g. circular, elliptical, polygonal such as hexagonal or octahedral. The transistor cells are arranged in the transistor cell area of the SiC semiconductor body. The transistor cell area may be an active area where an emitter region of an IGBT (or a source region of a MOSFET) and a collector region of an IGBT (or a drain region of a MOSFET) are arranged opposite to one another along the vertical direction. In the active area, a load current may enter or exit the semiconductor body of the power semiconductor device, e.g. via contact plugs on the first surface of the SiC semiconductor body. The vertical power semiconductor device may further include an edge termination area that may include a termination structure. In a blocking mode or in a reverse biased mode of the vertical power semiconductor device, the blocking voltage between the transistor cell area and a field-free region laterally drops across the termination structure. The termination structure may have a higher or a slightly lower voltage blocking capability than the transistor cell area. The termination structure may include a junction termination extension (JTE) with or without a variation of lateral doping (VLD), one or more laterally separated guard rings, or any combination thereof, for example.

For example, the gate structures may be planar gate structures, or may be trench gate structures. The gate structures may be the stripe-shaped. The gate structures may also have another layout or geometry in a plan view, e.g. hexagonal, square, circular, elliptic. The gate electrode of the gate structures may be electrically connected to the gate pad in the gate pad area via the gate interconnection, for example. The gate interconnection or a part thereof may be arranged outside of the transistor cell area, for example in an interconnection area arranged laterally between the transistor cell area and the edge termination area. The gate interconnection may include one or more conductive material(s), e.g. metal, metal alloys, e.g. Cu, Au, AlCu, Ag, or alloys thereof, metal compounds, e.g. TiN, highly doped semiconductor material such as highly doped polycrystalline silicon. The one or more conductive materials may form a layer stack, for example. At least part of the gate interconnection may be a so-called gate runner that merges with the gate pad. The gate pad and, for example, the sensor electrode and/or a first load electrode pad, e.g. a source pad of a MOSFET or an emitter pad of an IGBT, may be part of a wiring area over the SiC semiconductor body. The wiring area may include one or more than one, e.g. two, three, four or even more wiring levels. Each wiring level may be formed by a single one or a stack of conductive layers, e.g. metal layer(s). The wiring levels may be lithographically patterned, for example. Between stacked wiring levels, an interlayer dielectric structure may be arranged. Contact plug(s) and/or contact line(s) may be formed in openings of the interlayer dielectric structure to electrically connect parts, e.g. metal lines or contact areas, of different wiring levels to one another. The sensor electrode may be formed by one or more metal or metal alloys of the wiring area, for example.

The first interlayer dielectric may be arranged in at least one of the transistor cell area, e.g. directly above the gate electrode and directly below the sensor electrode, in the gate interconnection area, e.g. directly above a conductive material in trenches having a potential of the gate electrode and directly below the sensor electrode. Thus, the first interface and the second interface of the first dielectric layer may face one another in at least one of the transistor cell area or the interconnection area. For example, the second interlayer dielectric may be or may include an oxide of silicon. The oxide of silicon may include deposited $SiO_2$ and/or thermal $SiO_2$, for example. In addition, or as an alternative, the second interlayer dielectric may be or may include a silicate glass, e.g. tetraethyl orthosilicate (TEOS), for example.

For example, materials of the sensor electrode at the first interface, gate electrode and/or gate interconnection at the second interface, first interlayer dielectric between the first and second interface, and gate dielectric between the gate electrode and the SiC semiconductor body may be chosen so that at normal operation temperatures, e.g. smaller than 250° C. and at nominal positive gate voltages, e.g. 18V, the first interlayer dielectric is electrically isolating the gate electrode from the sensor electrode and the gate dielectric is electrically isolating the gate electrode from the SiC semiconductor body. For this case the overall gate-to-sensor electrode leakage may be small, e.g. in or below the μA range. However, at higher temperatures, e.g. in case of a short circuit event, the conduction band offset at the first interface in the configuration examples described herein, allows for a much higher thermal leakage current flowing between i) the gate electrode (and/or the gate interconnection) and the sensor electrode than between ii) the gate electrode and the SiC semiconductor body. The leakage current through the first interlayer dielectric at high temperatures can be in general the sum of an electron current from the sensor electrode into the gate electrode (and/or the gate interconnection) and a hole current from the gate electrode (and/or the gate interconnection) into the sensor electrode. Typically, either the electron or the hole current is dominating depending on the respective band-offsets.

Once exceeding a certain critical temperature, the increasing leakage current between the gate electrode (and/or the gate interconnection) and the sensor electrode may allow for triggering a fast feedback loop that can be used to turn-off or shut-down the vertical power device via a reduction or turn-off of the gate-to-source voltage VGS. The configuration examples described herein for reducing the channel overdrive operate similar to a thermally sensitive resistor (thermistor) with a negative temperature coefficient (NTC). It can be either incorporated directly in the transistor cell area where sensor electrode is placed directly on top of the first interlayer dielectric that electrically isolates the gate electrode, and/or in distinct inactive device regions, e.g. gate interconnection area such as a gate runner area. In the configuration examples described herein including the first interlayer dielectric with a low conduction band offset (to the sensor electrode) compared to the conduction band offset of the gate dielectric (to the SiC semiconductor body), the original transistor cell area design, e.g. MOS system, that governs the channel properties does not need to be modified to achieve the desired functionality because the material of the gate electrode is less relevant for achieving the technical effect of reducing the channel overdrive in view of the leakage current flowing from the sensor electrode through the first interlayer dielectric towards the gate electrode. Thus, the configuration examples described herein may allow for increasing the short circuit ruggedness without affection of the area-specific on-state resistance, RonxA, of the vertical power semiconductor device.

For example, a portion of the sensor electrode at the first interface may be made of aluminum, copper, titanium, nickel, molybdenum, tungsten, or alloys thereof.

For example, a portion of the first interlayer dielectric at the first interface may be made of a high-k material.

For example, the high-k material may be an oxide of aluminum, an oxide of zirconium, a nitride of aluminum, an oxide of hafnium, an oxide of yttrium, an oxide of silicon nitride, silicon nitride, or aluminum nitride. The first interlayer dielectric may also include a layer stack of the above high-k materials, for example.

For example, the gate structures may include a gate dielectric arranged between the gate electrode and the SiC semiconductor body. A portion of the gate dielectric at a channel interface to the SiC semiconductor body may be high-k dielectric. In some other examples, a portion of the gate dielectric at a channel interface to the SiC semiconductor body may be an oxide, e.g. a thermal oxide such as thermal $SiO_2$ or a deposited and annealed oxide. The portion of the gate dielectric may also include a layer stack of dielectric materials, e.g. a combination of an oxide and a high-k material.

For example, the conduction band offset at the first interface of the first interlayer dielectric may be smaller than a conduction band offset at the channel interface. Thus, at a positive gate voltage (on-state) the onset of a thermionic electron tunneling current between the sensor electrode and the gate electrode occurs at a (much) lower threshold temperature compared to the onset of a thermionic tunneling current between gate electrode and the SiC semiconductor body. Thereby, the MOS interface and the gate oxide is not altered or degraded due to a large leakage current flowing from the gate electrode though the gate oxide into the semiconductor body.

For example, the gate structures may be planar or trench gate structures. At least a part of the second interface may be arranged in the transistor cell area. The part of the second interface may be directly opposite to, i.e. facing, the first interface.

For example, at least a part of the second interface may be arranged in the interconnection area. The part of the second interface may be directly opposite to the first interface. For example, the gate interconnection may include a gate resistor having a gate resistance in the range from 5Ω to 20Ω.

For example, the vertical power semiconductor device may further include a source or emitter electrode. The second interlayer dielectric may include a first interface to the source or emitter electrode. A conduction band offset at the first interface of the second interlayer dielectric may be larger than the conduction band offset at the first interface of the first interlayer dielectric. Thereby, thermally-assisted electron tunneling between the sensor electrode and the gate electrode and/or gate interconnection is triggered at lower temperatures than between the source or emitter electrode and the gate electrode and/or gate interconnection.

For example, the sensor electrode and the source or emitter electrode may be laterally spaced from one another. For example, the sensor electrode and the source or emitter electrode may be electrically isolated. For example, the sensor electrode may be electrically connected to a sensor pad area that may be electrically connected to external circuitry (e.g. a gate driver circuit). The sensor electrode and the source or emitter electrode may be separate parts of one or more wiring layer(s) in the wiring area, for example. For example, the sensor electrode and the source or emitter electrode may be formed of same conductive material(s). In some configuration examples, the conductive material(s) of the sensor electrode and the source or emitter electrode may at least partly differ from one another.

For example, the sensor electrode may laterally turn into the source or emitter electrode. A thermally-assisted electron tunneling between the sensor electrode and the gate electrode and/or gate interconnection may be sensed via the gate pad by a sense unit integrated into a gate driver circuit. The gate driver circuit may be integrated into a chip or die that is different from the chip or die of the SiC semiconductor body of the vertical power semiconductor device, for example.

For example, the conduction band offset at the first interface of the second interlayer dielectric may be by 0.5 eV to 1.5 eV larger than the conduction band offset at the first interface of the first interlayer dielectric. Thereby, when exceeding a certain critical temperature, the increasing electron leakage current flow is predominantly flowing through the first interlayer dielectric.

Another configuration example of a vertical power semiconductor device includes a silicon carbide, SiC, semiconductor body having a first surface and a second surface opposite to the first surface. The SiC semiconductor body includes a transistor cell area comprising gate structures, a gate pad area, and an interconnection area electrically coupling a gate electrode of the gate structures and a gate pad of the gate pad area via a gate interconnection. The vertical power semiconductor device further includes a sensor electrode. The vertical power semiconductor device further includes a first interlayer dielectric comprising a first interface to the sensor electrode and a second interface to at least one of the gate electrode or the gate interconnection. A value of a valence band offset at the second interface of the first interlayer dielectric may range from 1.0 eV to 2.5 eV, or from 1.5 eV to 2.1 eV. The vertical power semiconductor device may further include a second interlayer dielectric comprising a second interface to at least one of the gate electrode or the gate interconnection. The second interlayer dielectric may laterally adjoin to the first interlayer dielectric. Once exceeding a certain critical temperature, the increasing hole leakage current between the gate electrode (and/or the gate interconnection) and the sensor electrode may allow for triggering a fast feedback loop that can be used to turn-off or shut-down the vertical power device via a reduction or turn-off of the gate-to-source voltage VGS.

The band offset (e.g., the conduction band offset) at the first interface may correspond to the band offset (e.g., the conduction band offset) between the material of the first interlayer dielectric and the material of the sensor electrode. Likewise, the band offset (e.g., the valence band offset) at the second interface may correspond to the band offset (e.g., the valence band offset) between the material of the first interlayer dielectric and the material of the gate dielectric. For example, the material of the first interlayer dielectric and the sensor electrode may be chosen such that the desired band offset (e.g., the conduction band offset) is achieved. Separately or in combination, the material of the first interlayer dielectric and the gate dielectric may be chosen such that the desired band offset (e.g., the valence band offset) is achieved. It may be further required to choose the material of the first interlayer dielectric and the gate dielectric such that a desired band offset (e.g., conduction or valence band offset) is achieved.

For example, the vertical semiconductor device may further include a source or emitter electrode. The second interlayer dielectric may include a second interface to at least one of the gate electrode or the gate interconnection. A valence band offset at the second interface of the second interlayer dielectric may be larger than the valence band offset at the second interface of the first interlayer dielectric. Thereby, thermally-assisted hole tunneling between the sensor electrode and the gate electrode and/or gate interconnection is triggered at lower temperatures than between the source or emitter electrode and the gate electrode and/or gate interconnection.

For example, a value of the valence band offset at the second interface of the second interlayer dielectric may be by 0.5 eV to 3.0 eV larger than a value of the valence band offset at the second interface of the first interlayer dielectric. Thereby, when exceeding a certain critical temperature, the increasing hole leakage current flow is limited through the first interlayer dielectric.

Another example of the present disclosure relates to a power system. The power system may include the vertical power semiconductor device of any of the configuration examples described herein. The power system may further include a gate driver circuit electrically coupled to the sensor electrode. The gate driver circuit may include a sensor unit. The sensor unit may be configured to generate a sense signal value, wherein generating the sense signal value may include sensing a current from the sensor electrode and to generate a comparison result by comparing the sense signal value with a threshold value. The sensor unit may be further configured to, depending on the comparison result, causing the gate driver circuit to turn off the vertical power semiconductor device by applying a gate turn off signal, e.g. VGS=0 V, to the gate electrode.

Sensing the current from the sensor electrode may be carried out via a separate sensor pad of the vertical power semiconductor device or via the leakage current from the gate pad in case the sensor electrode is electrically connected to the source and emitter electrode. Generating the sense signal value may be carried out by sensing a voltage drop of the leakage current from the sensor electrode over a resistor, e.g. sense resistor or gate resistor. Sensing the current from the sensor electrode connected to the source or emitter electrode may be carried out during a steady state of the gate voltage, for example. Sensing the current from the sensor electrode separated from the source or emitter electrode may also be permanently carried out, for example.

For example, the power system may comprise a first chip including the vertical power semiconductor device, and a second chip including the gate driver circuit.

The examples and features described above and below may be combined.

Some of the above and below examples are described in connection with a silicon carbide semiconductor body or substrate. Alternatively, a wide band gap semiconductor substrate, e.g. a wide band gap wafer, may be processed, e.g.

comprising a wide band gap semiconductor material different from silicon carbide. The wide band gap semiconductor wafer may have a band gap larger than the band gap of silicon (1.12 eV). For example, the wide band gap semiconductor wafer may be a silicon carbide (SiC) wafer, or gallium arsenide (GaAs) wafer, or a gallium nitride (GaN) wafer.

More details and aspects are mentioned in connection with the examples described above or below. The description and drawings merely illustrate the principles of the disclosure. Furthermore, all examples recited herein are principally intended expressly to be only for illustrative purposes to aid the reader in understanding the principles of the disclosure and the concepts contributed by the inventor (s) to furthering the art. All statements herein reciting principles, aspects, and examples of the disclosure, as well as specific examples thereof, are intended to encompass equivalents thereof.

In the following, further examples of field effect transistors, FETs, are explained in connection with the accompanying drawings. Functional and structural details described with respect to the examples above shall likewise apply to the exemplary embodiments illustrated in the figures and described further below. In the illustrated examples, n-channel FETs are illustrated. However, the examples described herein may also be applied to p-channel devices, e.g. p-channel MOSFETs or p-channel IGBTs.

Details with respect to structure, or function, or technical benefit of features described above likewise apply to the examples below and vice versa.

FIG. 1A schematically and exemplarily illustrates part of a power semiconductor device 100 configured as a planar or trench gate SiC power MOSFET.

The power semiconductor device 100 includes a first interlayer dielectric 120 comprising a first interface 1221 to a sensor electrode 116 and a second interface 1222 to a gate electrode 1061 or a gate interconnection 114 such as a gate runner or gate interconnection line. A schematic band diagram illustrates a conduction band energy Ec versus a direction x/y. A conduction band offset $\Phi_{B,0}$ is present at the first interface 1221. The conduction band offset $\Phi_{B,0}$ may range from 1 eV to 2.5 eV, for example.

Figure 1B:
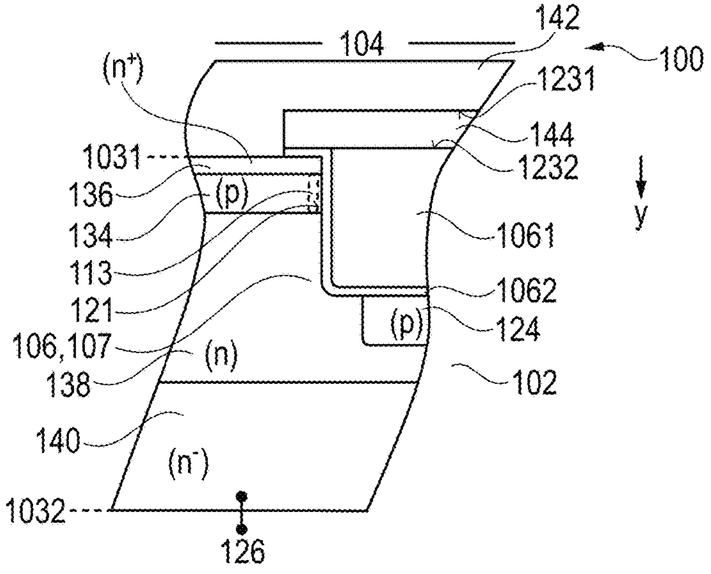
FIG. 1B schematically and exemplarily shows a partial cross-sectional view of a configuration example of a SiC power MOSFET including a trench gate structure.

FIG. 1B schematically and exemplarily shows a partial cross-sectional view of a configuration example of a power semiconductor device 100 configured as a trench gate SiC power MOSFET. The SiC power MOSFET is a vertical power semiconductor device that further includes an edge termination area that at least partially surrounds a transistor cell area 104 (not illustrated in FIGS. 2A and 2B).

A gate structure 106 includes a gate electrode 1061 that is electrically isolated from a SiC semiconductor body 102 by a gate dielectric 1062 of the gate structure 106. The gate dielectric 1062 adjoins to a channel region 113. The channel region 113 is defined by a part of a p-doped body region 134 that adjoins to the gate dielectric 1062 at a channel interface 121 to the gate structure 106. The gate structure 106 is configured as a trench gate structure 107. For example, a conductivity of the channel region 113 may be controlled by a potential applied to the gate electrode 1061, e.g. by field effect. For example, a positive voltage applied to the gate electrode 1061 may induce an n-type inversion channel in the channel region 113 adjoining to the gate dielectric 1062, for example. The p-doped body region 134 may be electrically connected to a source or emitter electrode 142 via the first surface 1031, e.g. by a contact plug of the source or emitter electrode 142 on a top surface of the body region 134 and/or a groove contact that may extend into the SiC semiconductor body 102 and/or may be electrically connected to the body region 134 via a sidewall of a groove contact (not illustrated in FIG. 2). The channel region 113 as part of the body region 134 may include a partial compensation by n-type dopants for adjusting the threshold voltage VTH, for example. The partial compensation may be achieved by a tilted ion implantation through a sidewall of a trench, for example. The gate dielectric 1062 of the gate structure 106 also adjoins to an $n^+$-doped source region 136 that is arranged between the p-doped body region 134 and the first surface 1031.

At a bottom side of the gate structure 106, the gate dielectric 1062 may adjoin to a p-doped diode region 124. The p-doped diode region 124 may include one or a plurality of sub-regions overlapping one another along a vertical direction y. The p-doped diode region 124 may extend up to the first surface 1031 along a sidewall of the trench gate structure 107 that is opposite to sidewall where the channel interface 121 is located (not illustrated in FIG. 2). The gate dielectric 1062 of the gate structure 106 further adjoins to an n-doped current spread region 138 that is arranged between the p-doped body region 134 and an n-doped drift region 140. The n-doped drift region 140 has a smaller doping concentration than the current spread region 138. The drift region 140 is electrically connected to a drain or collector electrode 126 at the second surface 1032 of the SiC semiconductor body 102. Between the drift region 140 and the second surface 1032 further doped semiconductor regions may be arranged, e.g. a highly n-doped drift contact region, or an n-doped field stop region.

A second interlayer dielectric 144 is arranged on top of the gate electrode 1061 with an intermediate second interface 1232. The source or emitter electrode 142 is arranged on top of the second interlayer dielectric 144 with an intermediate first interface 1231. The conduction band offset at the first interface 1231 of the second interlayer dielectric 144 is larger than a conduction band offset at the first interface 1221 of the first interlayer dielectric 120 illustrated in FIG. 1A.

Figure 1C:
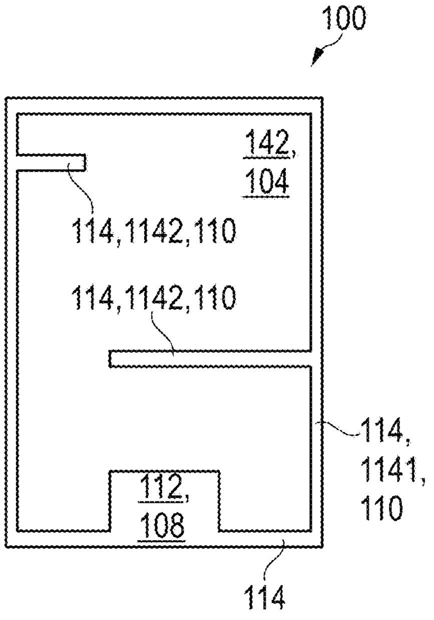
FIG. 1C schematically and exemplarily shows a top view of a configuration example of a SiC power MOSFET.

The schematic top view of FIG. 1C is a schematic and exemplary top view for illustrating a configuration example of a vertical power semiconductor device 100. The vertical power semiconductor device includes a gate pad 112 in a gate pad area 108. A gate interconnection 114 in an interconnection area 110 electrically connects a gate electrode (not illustrated in FIG. 1C) to the gate pad 112. The gate interconnection includes a gate runner 1141 and gate fingers 1142. Transistor cells (not illustrated in FIG. 1C) of the vertical power semiconductor device 100 are arranged below a source or emitter electrode 142 in the transistor cell area 104. The sensor electrode 116 of FIG. 1A may be integrated into the interconnection area 110 and/or the transistor cell area 104.

The schematic top and cross-sectional views of FIGS. 2A to 5B relate to configuration examples for illustrating arrangements of the sensor electrode of a vertical power semiconductor device 100.

Figure 2A:
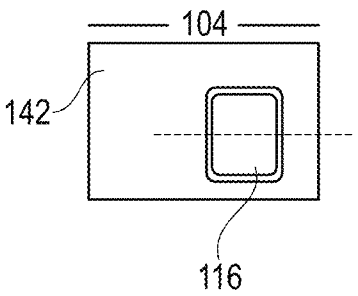
FIGS. 2A to 5B schematically and exemplarily show top and partial cross-sectional views of configuration examples of a SiC power MOSFET including a sensor electrode.
Figure 2B:
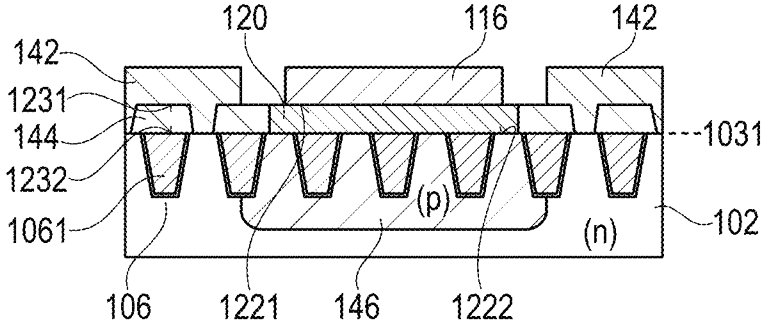

Referring to the configuration example illustrated in the schematic top view of FIG. 2A and the corresponding cross-sectional view of FIG. 2B, the sensor electrode 116 is arranged in the transistor cell area 104 and is laterally separated from the source or emitter electrode 142. The first interlayer dielectric 120 has a first interface 1221 to the sensor electrode 116 and a second interface 1222 to the gate electrode 1061. A second interlayer dielectric 144 has a first interface 1231 to the source or emitter electrode 142 and a second interface 1232 to the gate electrode 1061. The second interlayer dielectric 144 laterally adjoins to the first interlayer dielectric 120. The sensor electrode 116 is electrically isolated from a deep p-doped well 146 by the first interlayer dielectric 120. Once exceeding a certain critical temperature, the electron leakage current between the gate electrode 1061 and the sensor electrode 116 may be sensed via a sense pin and a sensor pad, e.g. by an external sensor unit. This may allow for triggering a fast feedback loop that can be used to turn-off or shut-down the vertical power device 100 via a reduction or turn-off of the gate-to-source voltage VGS.

Figure 3A:
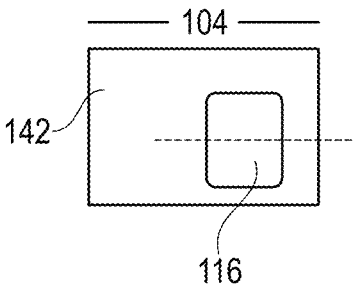
Figure 3B:
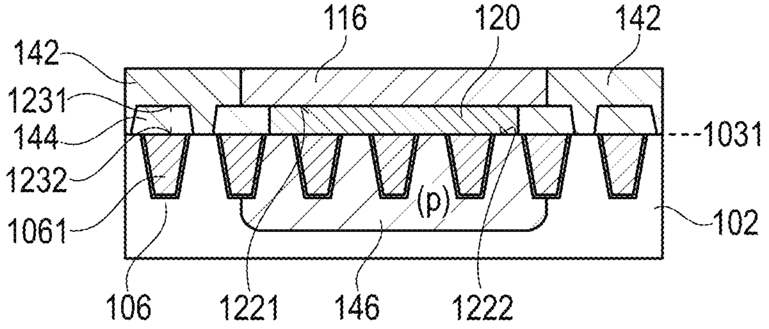

Referring to the configuration example illustrated in the schematic top view of FIG. 3A and the corresponding cross-sectional view of FIG. 3B, the sensor electrode 116 laterally adjoins to the source or emitter electrode 142. Once exceeding a certain critical temperature, the electron leakage current between the gate electrode 1061 and the sensor electrode 116 may be sensed as a gate to source leakage current via a gate pin and the gate pad 112, e.g. by an external sensor unit. This may allow for triggering a fast feedback loop that can be used to turn-off or shut-down the vertical power device 100 via a reduction or turn-off of the gate-to-source voltage VGS.

Figure 4A:
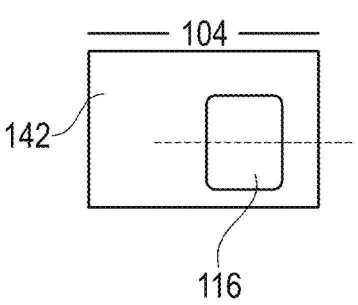
Figure 4B:
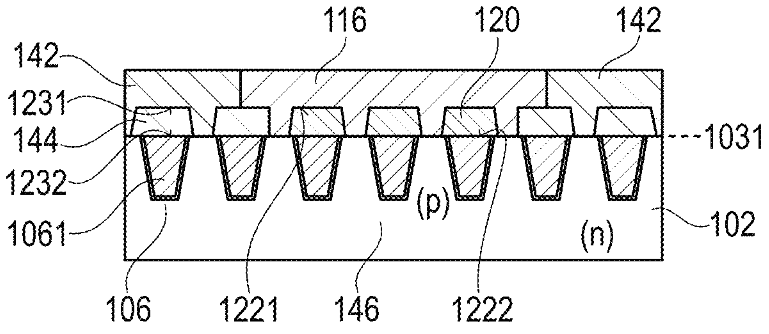

Referring to the configuration example illustrated in the schematic top view of FIG. 4A and the corresponding cross-sectional view of FIG. 4B, the sensor electrode 116 laterally adjoins to the source or emitter electrode 142. The deep p-doped well 146 of FIG. 3B is omitted in the configuration example of FIGS. 4A and 4B, and the sensor electrode 116 is electrically connected to the transistor cells in the SiC semiconductor body 102, e.g. via contact plugs.

Figure 5A:
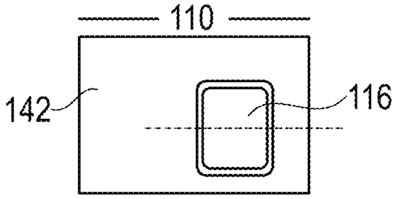
Figure 5B:
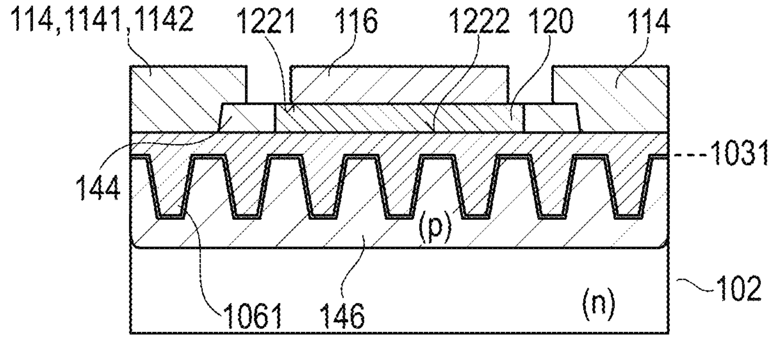

Referring to the configuration example illustrated in the schematic top view of FIG. 5A and the corresponding cross-sectional view of FIG. 5B, the sensor electrode 116 is arranged in an interconnection area 110 including the gate interconnection 114. The sensor 116 is laterally and electrically separated from the gate interconnection 114, e.g. the gate runner 1141 or the gate finger 1142 illustrated in FIG. 1C.

In the examples above, the increasing leakage current between the gate electrode 1061 (and/or the gate interconnection 114) and the sensor electrode 116 has been illustrated as an electron current over a conduction band offset $\Phi_{B,0}$ at the first interface 1221 of the first interlayer dielectric 120 that may trigger a fast feedback loop that can be used to turn-off or shut-down the vertical power device 100 via a reduction or turn-off of the gate-to-source voltage VGS.

Figure 6:
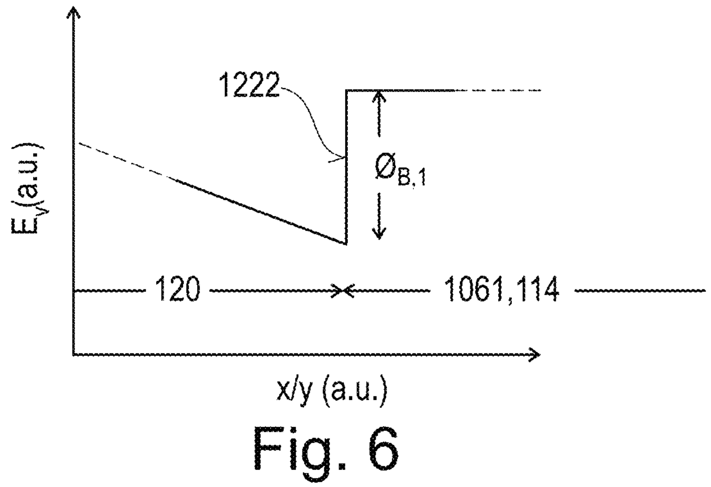
FIG. 6 schematically and exemplarily shows a band diagram of a valence band energy Ev including a second interface between a first interlayer dielectric and one of a gate electrode or a gate interconnection.

Referring to FIG. 6 illustrating a schematic band diagram of a valence band energy Ev versus a direction x/y, a hole leakage current over the second interface 1222 from the gate electrode 1061 or the gate interconnection 114 may also trigger a fast feedback loop that can be used to turn-off or shut-down the vertical power device 100 via a reduction or turn-off of the gate-to-source voltage VGS. A value of a valence band offset $\Phi_{B,1}$ at the second interface 1222 may range from 1.0 eV to 2.5 eV.

Figure 7A:
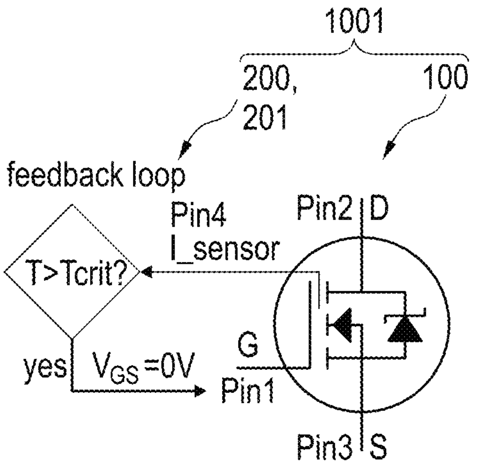
FIGS. 7A and 7B illustrate configuration examples of power systems including a vertical power semiconductor device and a gate driver circuit.
Figure 7B:
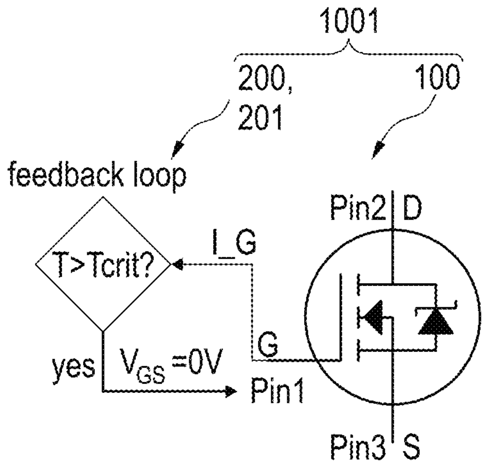

The schematic views of FIGS. 7A and 7B illustrate configuration examples of power systems 1001.

Referring to FIG. 7A, the power system 1001 includes a vertical power semiconductor device 100 that may be configured according to any of the configuration examples described herein. The vertical power semiconductor device 100 includes a drain electrode D electrically connected to a drain pin Pin2, a source electrode S electrically connected to a source pin Pin3 and a gate electrode G electrically connected to a gate pin PIN1. The vertical power semiconductor device 100 further includes a sensor pin Pin4 that is electrically connected to the sense electrode 116 of the vertical power semiconductor device 100. The sensor pin Pin4 is separated from the source pin Pin3 (see. e.g. configuration examples of FIGS. 2A, 2B, 5A, 5B).

The power system 1001 further includes a gate driver circuit 200 including a sensor unit 201 that is schematically illustrated in FIG. 7A by the feedback loop for generating a sense signal value by sensing a current I_sensor from the sensor pin Pin4 of the vertical power semiconductor device 100 and by generating a comparison result by comparing the sense signal value (e.g. a temperature T derived from the sensed current I_sensor) with a threshold value (e.g. a critical temperature Tcrit). Depending on the comparison result, the gate driver circuit 200 may to turn off the vertical power semiconductor device 100 by applying a gate turn off signal VGS=0 V to the gate electrode via the gate pin Pin1 in case the sensed temperature exceeds the critical temperature Tcrit.

In the configuration example of the power system 1001 illustrated in FIG. 7B, the sensor pin Pin4 of FIG. 7A is omitted since the sensor electrode 116 is electrically connected to the source electrode S (see e.g. configuration examples of FIGS. 3A, 3B, 4A, 4B). For this configuration example, a gate current I_G including the leakage current through the first interlayer dielectric from the sensor electrode is used in the feedback loop for generating the sense signal value.

In the power system 1001, the vertical power semiconductor device 100 and the gate driver circuit 200 may be integrated in separate dies or chips, for example.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A vertical power semiconductor device, comprising:
- a silicon carbide (SiC) semiconductor body having a first surface and a second surface opposite to the first surface, the SiC semiconductor body including a transistor cell area comprising gate structures, a gate pad area, and an interconnection area electrically coupling a gate electrode of the gate structures and a gate pad of the gate pad area via a gate interconnection;
- a sensor electrode;
- a first interlayer dielectric comprising a first interface to the sensor electrode and a second interface to at least one of the gate electrode or the gate interconnection, wherein a value of a conduction band offset at the first interface ranges from 1 eV to 2.5 eV; and
- a second interlayer dielectric comprising a second interface to at least one of the gate electrode or the gate interconnection, wherein the second interlayer dielectric laterally adjoins to the first interlayer dielectric.

2. The vertical power semiconductor device of claim 1, wherein a portion of the sensor electrode at the first interface is made of aluminum, copper, titanium, nickel, molybdenum, tungsten, or alloys thereof.

3. The vertical power semiconductor device of claim 1, wherein a portion of the first interlayer dielectric at the first interface is made of a high-k material.

4. The vertical power semiconductor device of claim 3, wherein the high-k material is an oxide of aluminum, an oxide of zirconium, a nitride of aluminum, an oxide of hafnium, an oxide of yttrium, an oxide of silicon nitride, silicon nitride, or aluminum nitride.

5. The vertical power semiconductor device of claim 1, wherein the gate structures comprise a gate dielectric arranged between the gate electrode and the SiC semiconductor body, and a portion of the gate dielectric at a channel interface to the SiC semiconductor body is a high-k dielectric.

6. The vertical power semiconductor device of claim 1, wherein the conduction band offset at the first interface is smaller than a conduction band offset at a channel interface to the SiC semiconductor body.

7. The vertical power semiconductor device of claim 1, wherein the gate structures are planar or trench gate structures, and at least a part of the second interface is arranged in the transistor cell area, the part of the second interface being directly opposite to the first interface.

8. The vertical power semiconductor device of claim 1, wherein at least a part of the second interface is arranged in the interconnection area, the part of the second interface being directly opposite to the first interface.

9. The vertical power semiconductor device of claim 1, further comprising:

a source or emitter electrode, wherein the second interlayer dielectric comprises a first interface to the source or emitter electrode, and wherein a conduction band offset at the first interface of the second interlayer dielectric is larger than the conduction band offset at the first interface of the first interlayer dielectric.

10. The vertical power semiconductor device of claim 9, wherein the sensor electrode and the source or emitter electrode are laterally spaced from one another.

11. The vertical power semiconductor device of claim 9, wherein the sensor electrode laterally turns into the source or emitter electrode.

12. The vertical power semiconductor device of claim 9, wherein the conduction band offset at the first interface of the second interlayer dielectric is 0.5 eV to 1.5 eV larger than the conduction band offset at the first interface of the first interlayer dielectric.

13. A power system, comprising:

the vertical power semiconductor device of claim 1;

a gate driver circuit electrically coupled to the sensor electrode, the gate driver circuit including a sensor unit, wherein the sensor unit is configured to:

generate a sense signal value, which includes to sense a current from the sensor electrode and to generate a comparison result by comparing the sense signal value with a threshold value; and depending on the comparison result, cause the gate driver circuit to turn off the vertical power semiconductor device by applying a gate turn off signal to the gate electrode.

14. The power system of claim 13, further comprising:

a first chip including the vertical power semiconductor device; and a second chip including the gate driver circuit.

* * * * *